United States Patent [19]

Cullinan et al.

[11] Patent Number: 5,773,311

[45] Date of Patent: Jun. 30, 1998

[54] METHOD FOR PROVIDING A TEST CONNECTION AND A PERMANENT CONNECTION SITE ON AN UNPACKAGED SEMICONDUCTOR DIE

[75] Inventors: Deborah A. Cullinan, Plymouth; Thomas J. Dunaway, New Hope, both of Minn.

[73] Assignee: Honeywell Inc., Minneapolis, Minn.

[21] Appl. No.: 638,420

[22] Filed: Apr. 26, 1996

[51] Int. Cl.[6] .................................................. H01L 21/60
[52] U.S. Cl. .............................. 437/209; 437/8; 437/183
[58] Field of Search ................................ 437/8, 183, 204, 437/209, 220

[56] References Cited

U.S. PATENT DOCUMENTS

| | | |
|---|---|---|
| 5,173,451 | 12/1992 | Kinsman et al. . |
| 5,495,667 | 3/1996 | Farnworth et al. ......................... 437/8 |
| 5,548,884 | 8/1996 | Kim ......................................... 437/183 |
| 5,550,083 | 8/1996 | Koidte et al. ........................... 437/183 |
| 5,559,054 | 9/1996 | Adamjee .................................. 437/183 |
| 5,578,526 | 11/1996 | Akram et al. ............................... 437/8 |

*Primary Examiner*—Kevin Picardat
*Attorney, Agent, or Firm*—Gregory A. Bruns

[57] ABSTRACT

A method of making a temporary connection to an unpackaged semiconductor die, removing the temporary connection and preparing the site of the temporary connection to receive a permanent connection.

10 Claims, 5 Drawing Sheets

COINED BOND KNOWN GOOD DIE ASSEMBLY

METHOD FOR PROVIDING A TEST CONNECTION AND A PERMANENT CONNECTION SITE ON AN UNPACKAGED SEMICONDUCTOR DIE

BACKGROUND OF THE INVENTION

The present invention relates generally to full fuctional testing of integrated circuit (IC) devices before assembly and particularly to a method for making a temporary or test connection at a connection site and the preparing the connection site for a permanent connection.

There is an interest in performing full functional testing of unpackaged semiconductor die prior to packaging. This is due in part to the cost associated with packaging even singular IC devices. However, in addition to singular IC devices there is increased interest in full functional testing of individual IC devices before the individual devices are assembled into multi-chip modules (MCMs).

IC devices may be tested as follows. A semiconductor die is placed in a chip package, e.g., a dual in-line package or a hermetic leaded chip carrier such as a flatpack, and die bonded by a temporary means. Thin wires are then connected from bond pads on the chip to leads in the chip package. The connection may be by wire bonding. The connections at the bond pads on the chip may be made in a way that results in a low strength bond. After the testing has been performed a force is applied to the wire to pull it from the bond pad on the chip. To understand the degree of process control that is necessary in order to control a temporary and removable wire bond, a figure is helpful. FIG. 1 illustrates a relationship of bond strength to bond squash, i.e., wire diameter. At the left of FIG. 1 is shown an all lift-off region 2 and a mixed lift-off and heel-break region 4. To the right of region 2 and region 4 is the all-heel break region 6. To be assured that all bonds will lift off, FIG. 1 indicates that the bond must have a bond squash that lies in region 6. The process tolerance of a representative wire bonding machine is approximately 0.3 wire diameter. The relationship shown in FIG. 1, along with the tolerance of 0.3 wire diameters, are believed to make it very difficult to provide wire bonds that will reliably lift off.

In the past it has been difficult to make a connection at the chip that allows it to be easily removed from the chip. This difficulty is at least partially explained by the relationships shown in FIG. 1. In practice, while typically some number of wires may be removed, some number of wires typically break and this leaves wire stubs. The mixture of bond pad condition after removing or breaking the wires is varied. That is, some pads do not have a wire stub and others have a wire stub. Removal of the remaining wire stubs must then be done on an individual basis using some form of hand tool. This wire stub removal is time consuming and expensive. In addition, even when the wire is removed, either by simply being pulled off or after some rework with a hand tool, there will be a deformed portion of the bond pad remaining. This deformed portion of the bond pad may cause problems when a permanent or production connection is made.

Thus a need exists for a method of making temporary test connections to a chip which can later be reliably removed and then preparing the connection site for a production connection or permanent connection.

SUMMARY OF THE INVENTION

The present invention solves this and other needs by providing a method for making a temporary connection to an IC die, removing the temporary connection and preparing the die to receive a permanent connection, including:

placing the die in a carrier;

attaching a leadwire having a shaped portion when it is attached so that when sufficient tensile force is applied to the wire it will break and leave the shaped portion on the die;

performing the testing.

applying sufficient tensile force to break the wire; and applying a controlled compressive force to form the shaped portion into a permanent connection site.

BRIEF DESCRIPTION OF THE DRAWINGS

The file of this patent contains at least one drawing executed in color. Copies of this patent with color drawing (s) will be provided by the Patent and Trademark Office upon request and payment of the necessary fee.

DETAILED DESCRIPTION OF INVENTION

Figure 2A:
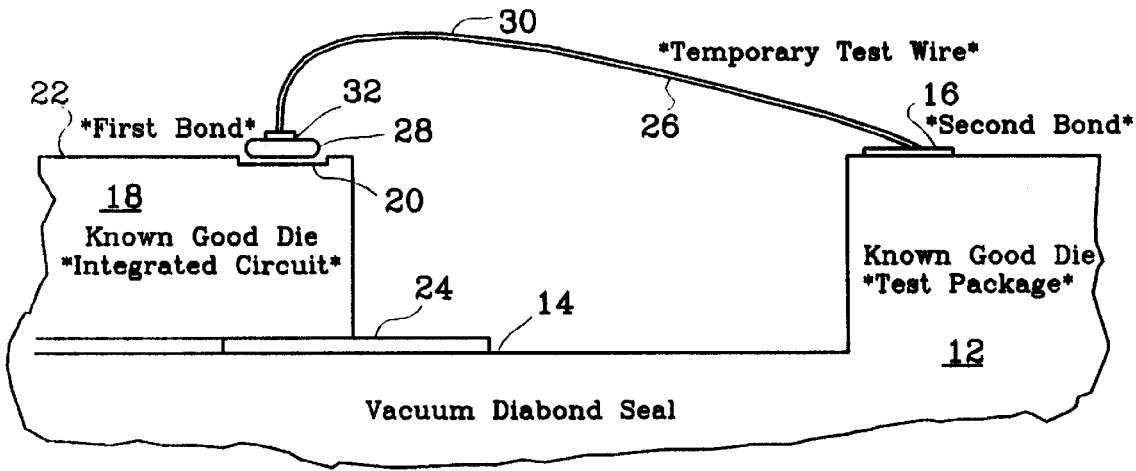
FIGS. 2a–2c are elevation drawings according to the principles of the present invention.

FIG. 2a shows a portion of an integrated circuit package or carrier 12 including die mounting surface 14 and package bond pad 16. Integrated circuit die 18 is located on surface 14 and includes a connection site or bond pad 20 located on sure 22. Die 18 is to be held in place temporarily by any suitable means. In FIG. 2a, a gasket material 24 is shown between surface 14 and die 18.

Alternatively, die 18 may be held in place temporarily by other means, for example, by water soluble wax.

Temporary test wire 26 extends from package bond pad 16 to bond pad 20 on surface 22 of die 18. Connection 28 in FIG. 2a is a ball bond connection which is somewhat oversquashed to provide for a predictable breakage of wire 26. As shown in FIG. 2a, test wire 26 has a uniform portion 30 and a non-uniform or shaped portion 32.

Shaped portion 32 is formed from a gold ball formed by conventional means. The size of the ball selected to be formed should be consistent with the bond pad dimensions and bond pitch of die 18. The set up of the ball bonding operation should provide for a bond squash in the all-heel break region 6 of FIG. 1 to insure that the wire 26 will break at shaped portion 32.

Figure 2B:
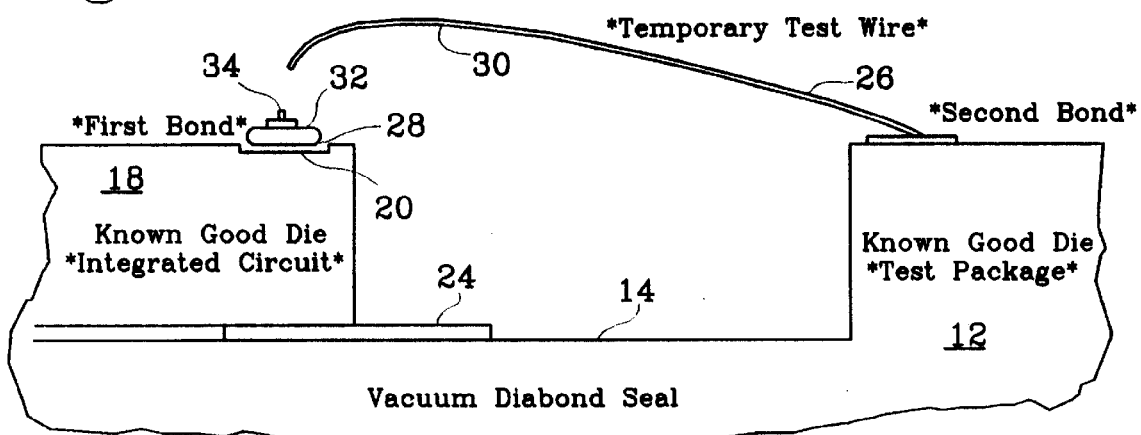
Figure 2C:
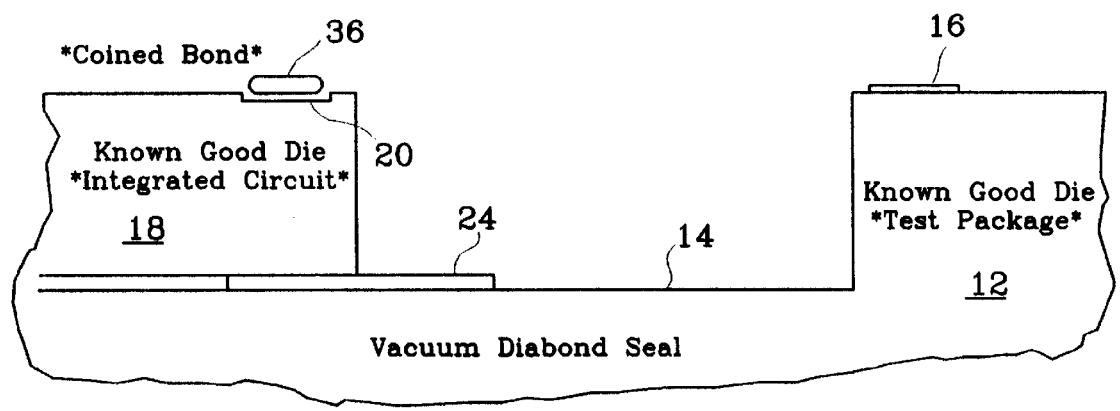
Figure 6A:
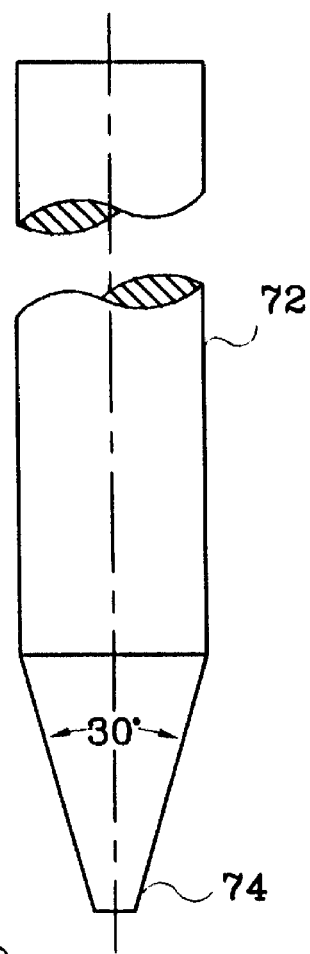
FIGS. 6a and 6b are an elevation view and a perspective view respectively which show additional details related to the present invention.
Figure 6B:
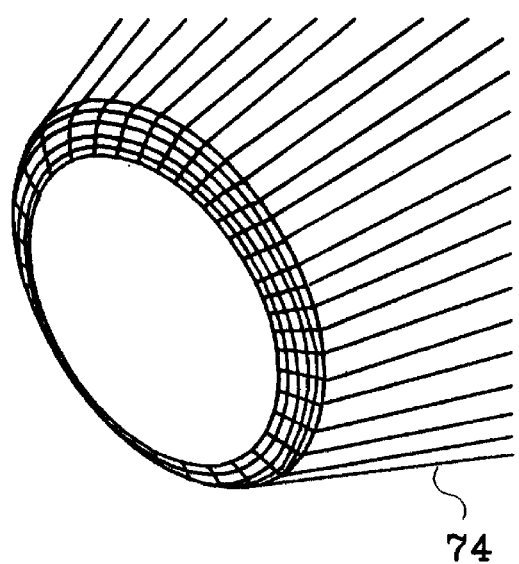

FIG. 2b shows wire 30 after sufficient tensile force has been applied to wire 26 to cause it to break at shaped portion 32 leaving a wire stub 34. The next step according to the principles of the present invention is to use a coining tool to compress or flatten shaped portion 32 to provide a coined bond or connection site 36. A coining tool that has been used successfully is of the type shown in FIGS. 6a and 6b, and is available from GAISER TOOL COMPANY. Connection site 36 is suitable for a production assembly connection or permanent connection.

Figure 3:
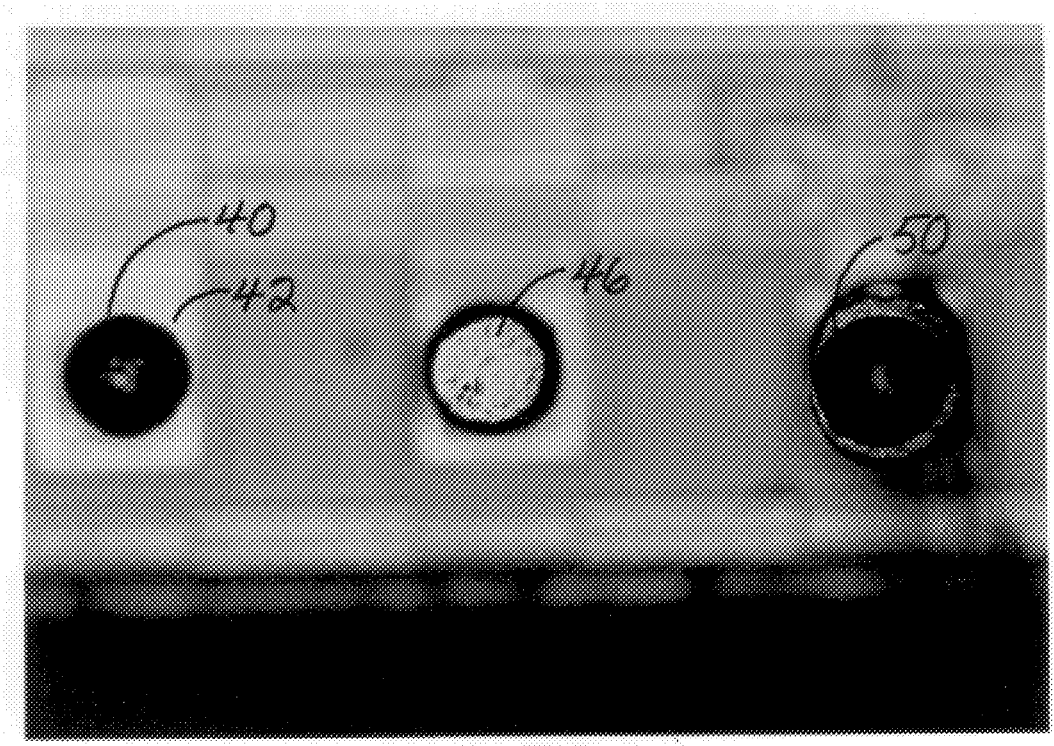
FIG. 3 is a photograph showing certain features of the present invention.
Figure 5:
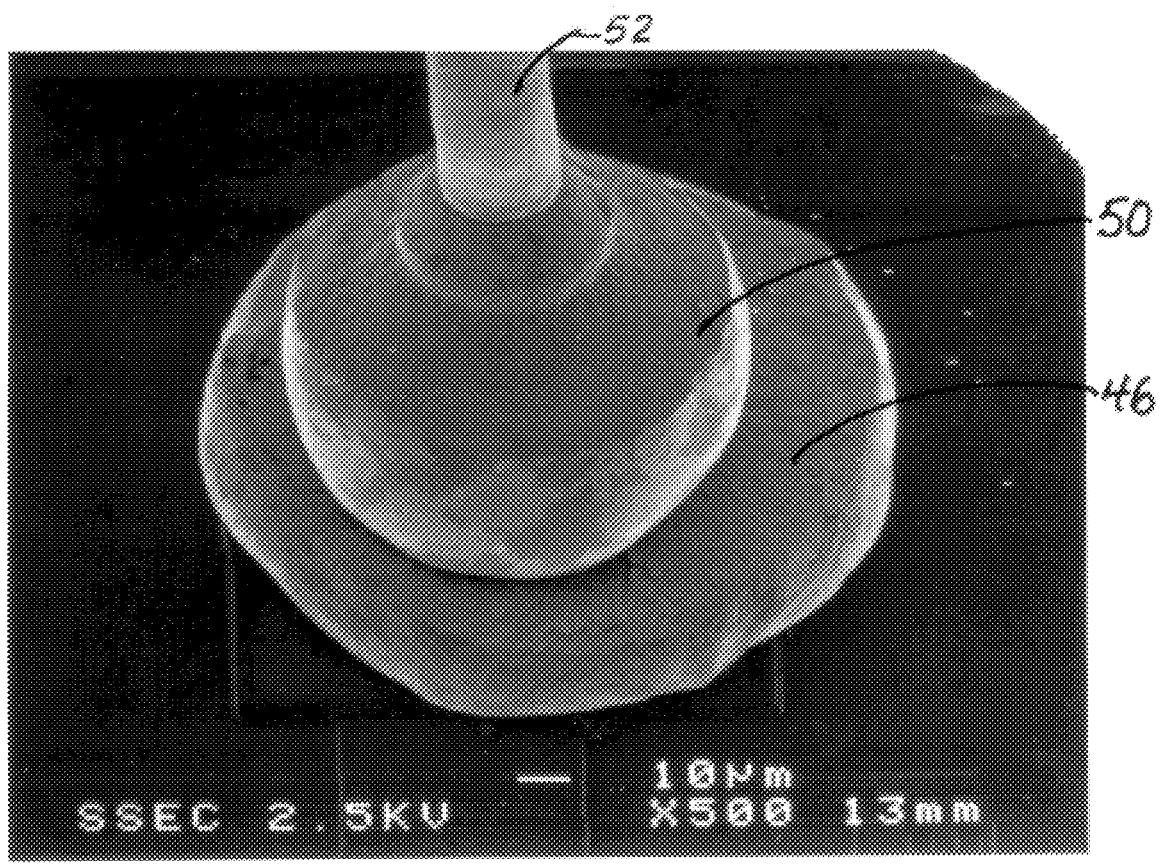
FIG. 5 is a photograph showing certain features of the present invention.

FIG. 3 shows from right to left a gold ball bond 40 remaining on gold bond pad 42 after the wire has been removed, a coined bond or connection site 46 formed by coining and a new ball bond 50 formed on the connection site. An enlarged view of new ball bond 50 having a wire 52 extending from it is shown in FIG. 5. New ball bond 50 is located on coined bond 46. Thus, in FIG. 3 and FIG. 5, it is shown that a remaining ball bond 40 can have a controlled compressive force applied to it by a coining tool to form it into a connection site 46.

Figure 4:
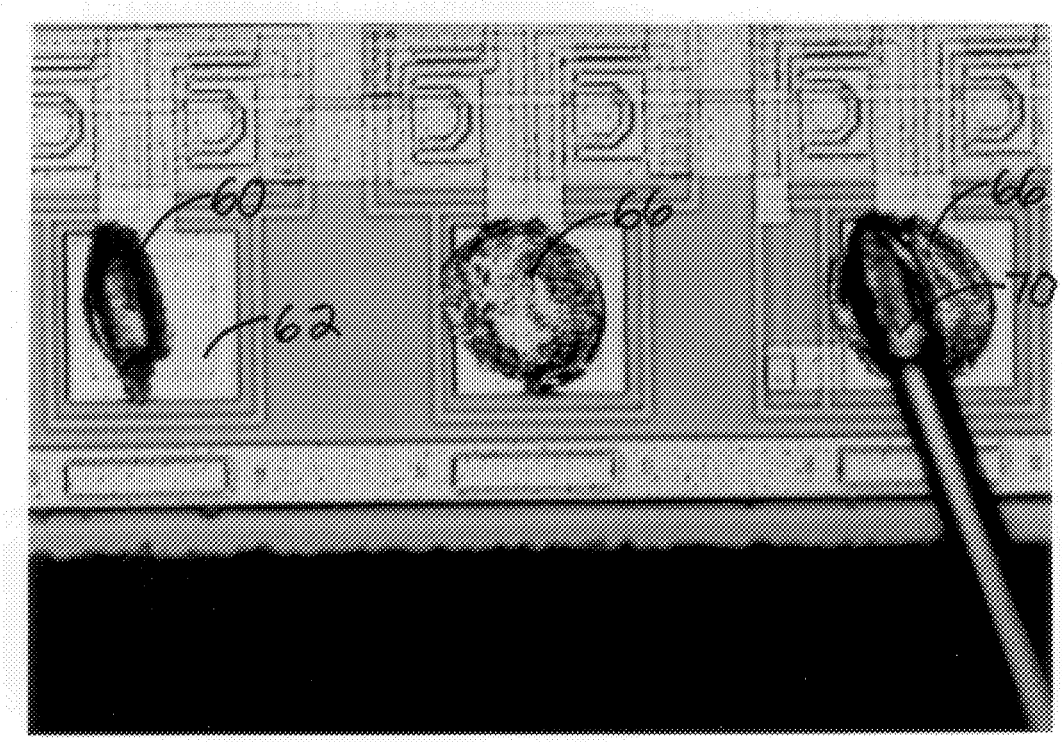
FIG. 4 is a photograph showing certain features of the present invention.

While the invention has been described in terms of a gold ball bond, it is to be understood that the invention applies to other bonding technologies. For example, the present invention applies to the use of wedge bonding of aluminum wire to an aluminum bond pad. FIG. 4 shows from left to right, respectively, an aluminum wire wedge bond 60 remaining on aluminum pad 62 after tensile force has been applied to the wire to cause it to break at shaped portion or at the heel of the wedge, a coined bond or connection site after being formed by coining, and a new wedge bond 70 formed on the new connection site. Thus, in FIG. 4 it is shown that a remaining wedge bond 60 can have a controlled compressive force applied to it by a coining tool to form it into a connection site 66.

Figure 1:
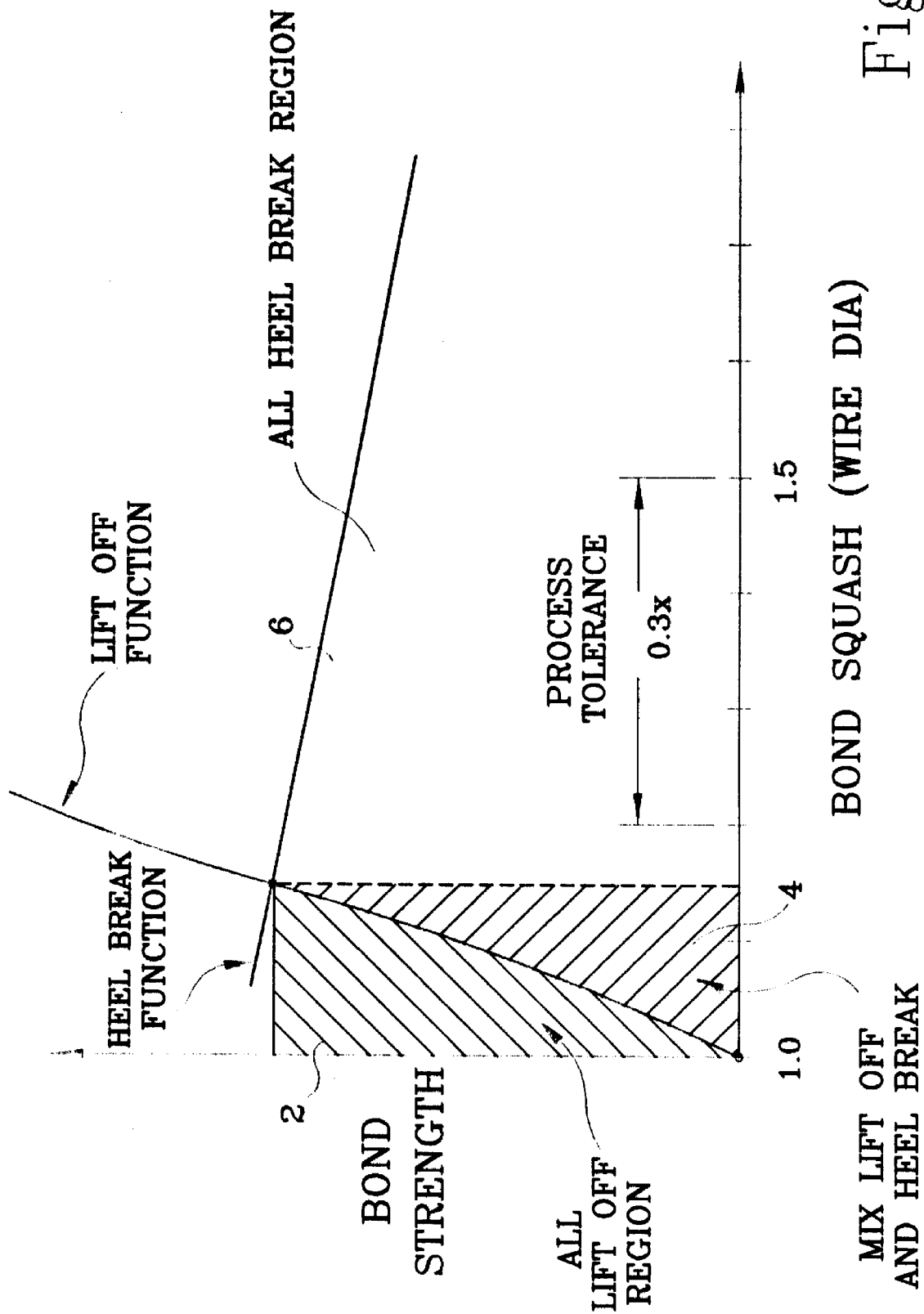
FIG. 1 is a graph illustrating certain relationships of bond strength and bond squash.

With reference to FIG. 1, it should be noted that the present invention uses a bond squash that would lie in the all-heel break region and preferably to the right of what would normally be used for a permanent bond. That is the temporary bond is somewhat oversquashed so that when a sufficient tensile force is applied to the wire it will break at the shaped portion or non-uniform portion.

The scope of the present invention is to be limited by the appended claims rather than by the foregoing description.

We claim:

1. Method for making a temporary connection to an integrated circuit die, removing said connection and preparing said die to receive a permanent connection, comprising the following steps:

placing said die in a carrier having provision for connecting leadwires extending from said die to said carrier;

attaching a leadwire to a connection site at said die, with said leadwire having a uniform portion and a shaped portion so that when sufficient tensile force is applied to said leadwire it will break at said shaped portion leaving said shaped portion attached to said connection site;

performing testing of said die;

applying sufficient tensile force to said leadwire to break said leadwire; and applying a controlled compressive force to said shaped portion to form said shaped portion into a connection site to receive said permanent connection.

2. Method of claim 1 wherein said step of placing said die in said carrier includes the step of temporarily securing said die in said carrier.

3. Method of claim 2 wherein said leadwire is gold and said connection is a ball bond connection.

4. Method of claim 2 wherein said leadwire is aluminum and said connection is a wedge bond.

5. Method of claim 2 wherein said compressive force is applied with a coining tool.

6. Method for making a temporary connection to an integrated circuit die, removing said connection and preparing said die to receive a permanent connection, comprising the following steps:

placing said die in a carrier having provision for connecting leadwires extending from said die to said carrier;

attaching a leadwire to a bonding pad located on said die, with said leadwire having a uniform portion and a non-uniform portion so that when sufficient tensile force is applied to said leadwire it will break at said non-uniform portion leaving said non-uniform portion attached to said bonding pad;

performing testing of said die;

applying sufficient tensile force to said leadwire to break said leadwire; and applying a controlled compressive force to said non-uniform portion to form a connection site to receive said permanent connection.

7. Method of claim 6 wherein said step of applying a controlled compressive force is performed using a coining tool.

8. Method of claim 7 wherein said step of pacing said die in said carrier includes the step of temporarily securing said die in said carrier.

9. Method of claim 7 wherein said leadwire is gold and said connection is a ball bond connection.

10. Method of claim 7 wherein said leadwire is aluminum and said connection is a wedge bond.

* * * * *